(12) United States Patent
Farmer et al.

(10) Patent No.: US 8,183,575 B2
(45) Date of Patent: May 22, 2012

(54) METHOD AND APPARATUS FOR PROVIDING A PATTERNED ELECTRICALLY CONDUCTIVE AND OPTICALLY TRANSPARENT OR SEMI-TRANSPARENT LAYER OVER A LIGHTING SEMICONDUCTOR DEVICE

(75) Inventors: Todd Farmer, Sunnyvale, CA (US); Steve Lester, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/359,934

(22) Filed: Jan. 26, 2009

(65) Prior Publication Data
US 2010/0187564 A1 Jul. 29, 2010

(51) Int. Cl.
*H01L 33/42* (2010.01)
*H01L 33/20* (2010.01)
(52) U.S. Cl. ............... 257/79; 257/E33.005; 438/22
(58) Field of Classification Search .......... 438/22, 438/34; 257/E33.001, E33.005, 79, 86, 94
See application file for complete search history.

(56) References Cited

U.S. PATENT DOCUMENTS

| | | | | |
|---|---|---|---|---|
| 7,645,625 B2 * | 1/2010 | Ono et al. | ......... | 438/38 |
| 7,800,122 B2 * | 9/2010 | Chiu et al. | ......... | 257/98 |
| 2002/0123165 A1 | 9/2002 | Ishimaru | | |
| 2005/0035354 A1 | 2/2005 | Lin et al. | | |
| 2006/0097271 A1 * | 5/2006 | Eisert et al. | ......... | 257/91 |
| 2007/0126013 A1 * | 6/2007 | Kim et al. | ......... | 257/91 |
| 2008/0006842 A1 * | 1/2008 | Seong et al. | ......... | 257/99 |
| 2008/0035941 A1 * | 2/2008 | Harle | ......... | 257/98 |
| 2009/0009057 A1 * | 1/2009 | Lee et al. | ......... | 313/503 |
| 2009/0078951 A1 * | 3/2009 | Miki et al. | ......... | 257/98 |
| 2009/0184334 A1 * | 7/2009 | Lee et al. | ......... | 257/98 |

FOREIGN PATENT DOCUMENTS
WO WO 2007004701 A1 * 1/2007

OTHER PUBLICATIONS

Ham et al., "Integrated lighting control apparatus using optic lens and semiconductor light emitting device, and control method thereof, especially capable of maintaining good illuminance with low electric energy", (2006), pages: English Abstract and fig. 1.*

* cited by examiner

*Primary Examiner* — Hsien Ming Lee
*Assistant Examiner* — Michele Fan
(74) *Attorney, Agent, or Firm* — JW Law Group; James M. Wu

(57) ABSTRACT

A light emitting diode ("LED") using an electrical conductive and optical transparent or semi-transparent layer to improve overall light output is disclosed. The device includes a first conductive layer, an active layer, a second conductive layer, an electrical conductive and optical transparent or semi-transparent layer, and electrodes. In one embodiment, the electrical conductive and optical transparent or semi-transparent layer has a first surface and a second surface, wherein the first surface is overlain the second conductive layer. The second surface includes a pattern which contains thick regions and thin regions for facilitating light passage.

26 Claims, 14 Drawing Sheets

Step 4

Step 5

Step 6

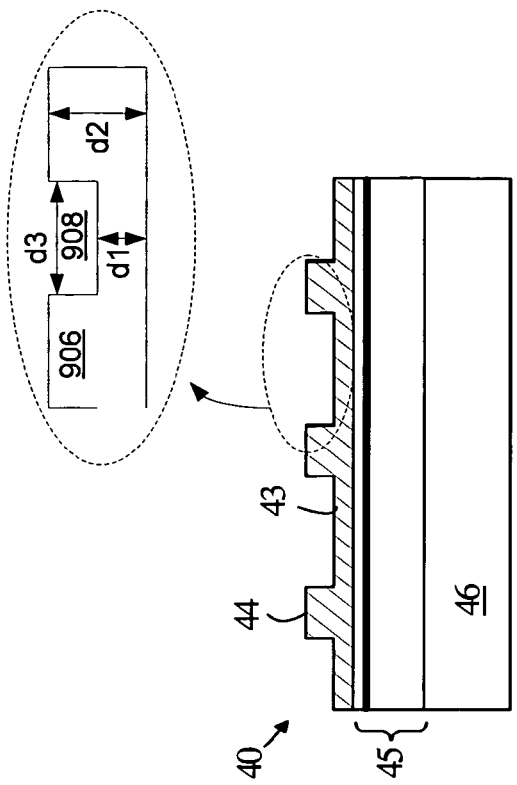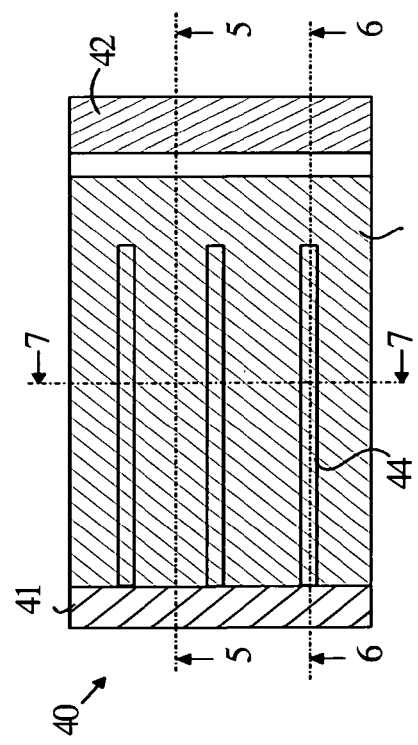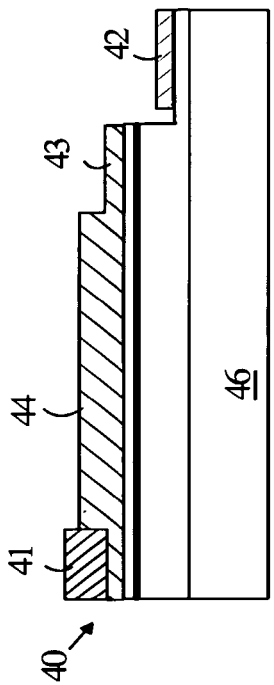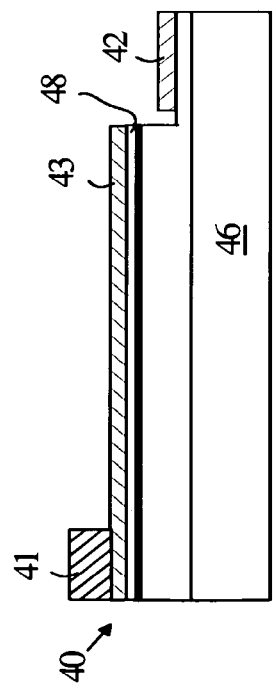
FIG. 4
FIG. 5
FIG. 6
FIG. 7

1312
1310

Step 1

1314
1312
1310

Step 2

1316
1314
1312
1310

Step 3

US 8,183,575 B2

METHOD AND APPARATUS FOR PROVIDING A PATTERNED ELECTRICALLY CONDUCTIVE AND OPTICALLY TRANSPARENT OR SEMI-TRANSPARENT LAYER OVER A LIGHTING SEMICONDUCTOR DEVICE

FIELD

The exemplary aspect(s) of the present invention relates to lighting devices. More specifically, the aspect(s) of the present invention relates to solid state light emitting devices using a patterned conductive layer.

BACKGROUND

A light emitting diode ("LED") is a lighting semiconductor device capable of converting electrical energy to light. With recent improvements in luminous output from an LED, conventional lighting apparatus such as incandescent light bulbs and/or fluorescent lamps are likely to be replaced with LEDs in the foreseeable future. Various commercial applications of LEDs, such as traffic lights, automobile lightings, and electronic billboards, have already been placed in service.

An LED is a semiconductor diode with a biased p-n junction capable of emitting narrow-spectrum of electroluminescence. For example, when a current passes through the LED, it emits light. The light is essentially a form of energy releasing when electrons and holes are recombined. While the wavelength of emitted light may vary depending on the composition of materials, the amount of light that can be produced also depends on various parameters such as current availability across the LED.

To increase light output, a conventional approach is to increase current flow to the LED. A conventional approach, for example, deposits a heavy and/or thick electrically conductive layer over an LED to increase current distribution. A drawback, however, associated with this conventional approach is that although the thick electrical conductive layer can provide additional current flow, it also hampers light from passing through the electrical conductive layer partially due to its thickness.

SUMMARY

A light emitting diode ("LED") using a patterned electrical conductive and optical transparent or semi-transparent layer to improve overall light output is disclosed. The LED or device includes a first conductive layer, an active layer, a second conductive layer, an electrical conductive and optical transparent or semi-transparent layer, and electrodes. The electrical conductive and optical transparent or semi-transparent layer has a first surface and a second surface, wherein the first surface is deposited directly or indirectly over the second conductive layer. The electrical conductive and optical transparent or semi-transparent layer, in one aspect, is an indium tin oxide ("ITO") layer deposited over the second conductive layer. The second surface includes a pattern which has thick regions and thin regions for facilitating current spreading and light passage.

Additional features and benefits of the exemplary aspect(s) of the present invention will become apparent from the detailed description, figures and claims set forth below.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

FIG. 4 is a top view of LED 40 in accordance with one aspect of the present invention;

FIGS. 5-7 are cross-sectional views of LED 40 through lines 5-5, 6-6, and 7-7, respectively, in accordance with one aspect of the present invention;

DETAILED DESCRIPTION

Aspect(s) of the present invention is described herein in the context of a method, device, and apparatus of employing an electrically conductive and optically transparent or semi-transparent layer having a pattern containing thick regions and thin regions.

Those of ordinary skills in the art will realize that the following detailed description of the exemplary aspect(s) is illustrative only and is not intended to be in any way limiting. Other aspects will readily suggest themselves to such skilled persons having the benefit of this disclosure. Reference will now be made in detail to implementations of the exemplary aspect(s) as illustrated in the accompanying drawings. The same reference indicators will be used throughout the drawings and the following detailed description to refer to the same or like parts.

In the interest of clarity, not all routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skills in the art having the benefit of this disclosure.

It is understood that the aspect of the present invention may contain integrated circuits that are readily manufacturable using conventional semiconductor technologies, such as CMOS ("complementary metal-oxide semiconductor") technology, or other semiconductor manufacturing processes. In addition, the aspect of the present invention may be implemented with other manufacturing processes for making optical as well as electrical devices.

Figure 2:
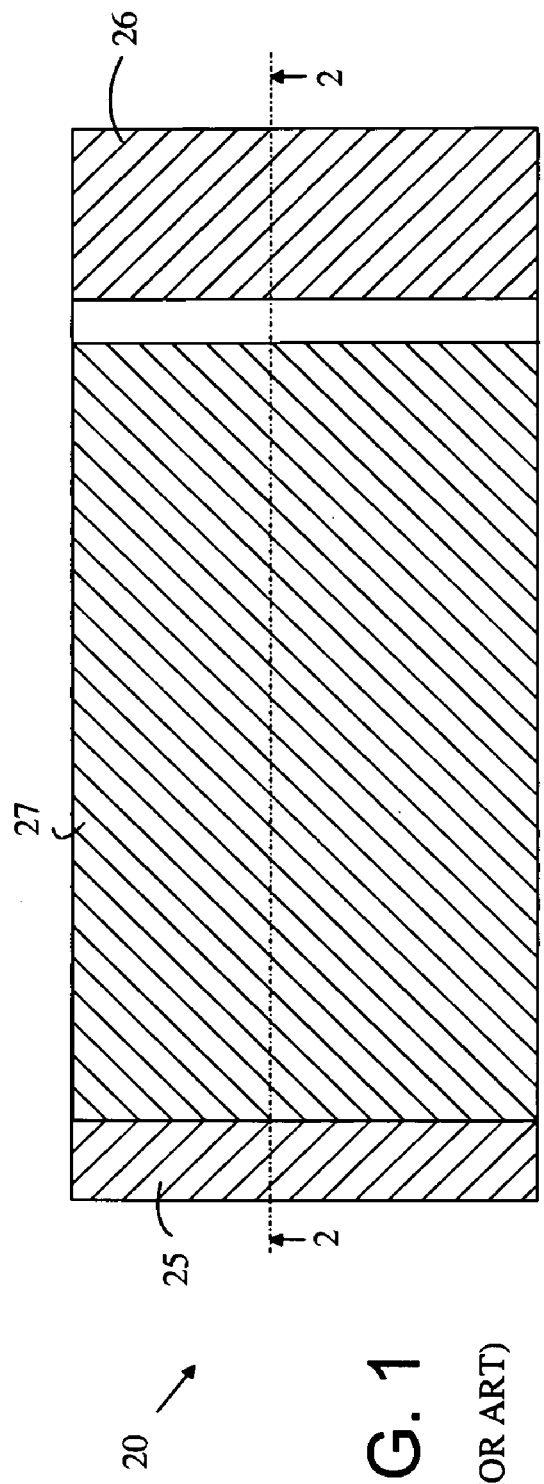
FIG. 2 is a cross-sectional view of prior art LED 20 through line 2-2 shown in FIG. 1.
Figure 1:
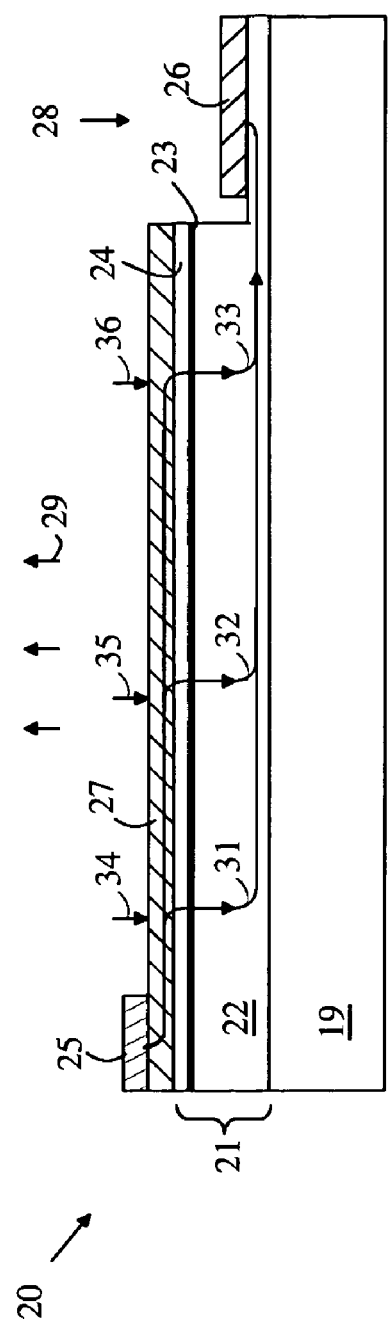
FIG. 1 is a prior art top view of prior art LED 20.

The manner in which the aspect(s) of the present invention provides its advantages can be more easily understood with reference to FIGS. 1 and 2, which illustrate a prior art GaN-based LED. FIG. 1 is top view of LED 20, and FIG. 2 is a cross-sectional view of LED 20 through line 2-2 shown in FIG. 1. LED 20 is constructed by growing three layers on a sapphire substrate 19. The first layer 22 is an n-type material. The second layer 23 is an active layer that emits light when holes and electrons combine therein. The third layer is a p-type layer 24. Each of these layers may include a number of sub-layers. Since the functions of these sub-layers are well known in the art and are not central to the present discussion, the details of these sub-layers have been omitted from the drawings and the following discussion.

A mesa 28 is etched through layers 23 and 24 and a contact 26 is deposited on the bottom surface of mesa 28 to provide an electrical connection to layer 22. The electrical connection to layer 24 is provided by an electrical conductive and optical transparent or semi-transparent layer 27 that is typically constructed from indium tin oxide (ITO). Layer 27 is connected to a second contact 25 that provides the electrical connection to the power source. When power is provided to contacts 25 and 26, light is generated in active layer 23 and extracted from LED 20 through electrical conductive and optical transparent or semi-transparent layer 27 as shown at 29.

The resistivity of p-type GaN is much greater than that of the n-type GaN. To maximize the light generation efficiency of LED 20, the current density across active layer 23 should be uniform. That is, the resistances of paths 31-33 should all be the same. In the absence of layer 27, the resistance of path 31 would be smaller than that of path 33, and hence, light generation would be concentrated in the active region around path 31 leading to a gradient in intensity across the surface of the LED. While the resistivity of ITO is significantly less than that of the p-type GaN, the resistance through the ITO layer is not negligible. As the power output of LEDs is increased, the losses in the ITO become significant and a gradient in light intensity results unless the ITO layer is increased in thickness. Unfortunately, as the ITO thickness increases, the amount of light absorbed in the ITO also increases. The light losses from absorption of light in the ITO become significant when the layer is increased to accommodate the current densities required in high power LEDs.

To simplify the following discussion, it will be assumed that the sheet resistance of the n-type GaN layer is much less than that of ITO layer 27. The goal of the ITO layer is to minimize the voltage differences between contact 25 and various points on the surface of the ITO layer. The voltage drop between contact 25 and each of the points shown at 34-36 will be proportional to the distance from between the points in question and contact 25. The voltage drop is also inversely proportional to the thickness of the ITO layer. In general, there is some acceptable voltage drop that is determined by the degree of non-uniformity in the light that is acceptable and the acceptable power losses in the ITO layer. In prior art devices, the thickness of the ITO layer is set to provide this level of voltage drop.

Figure 3:
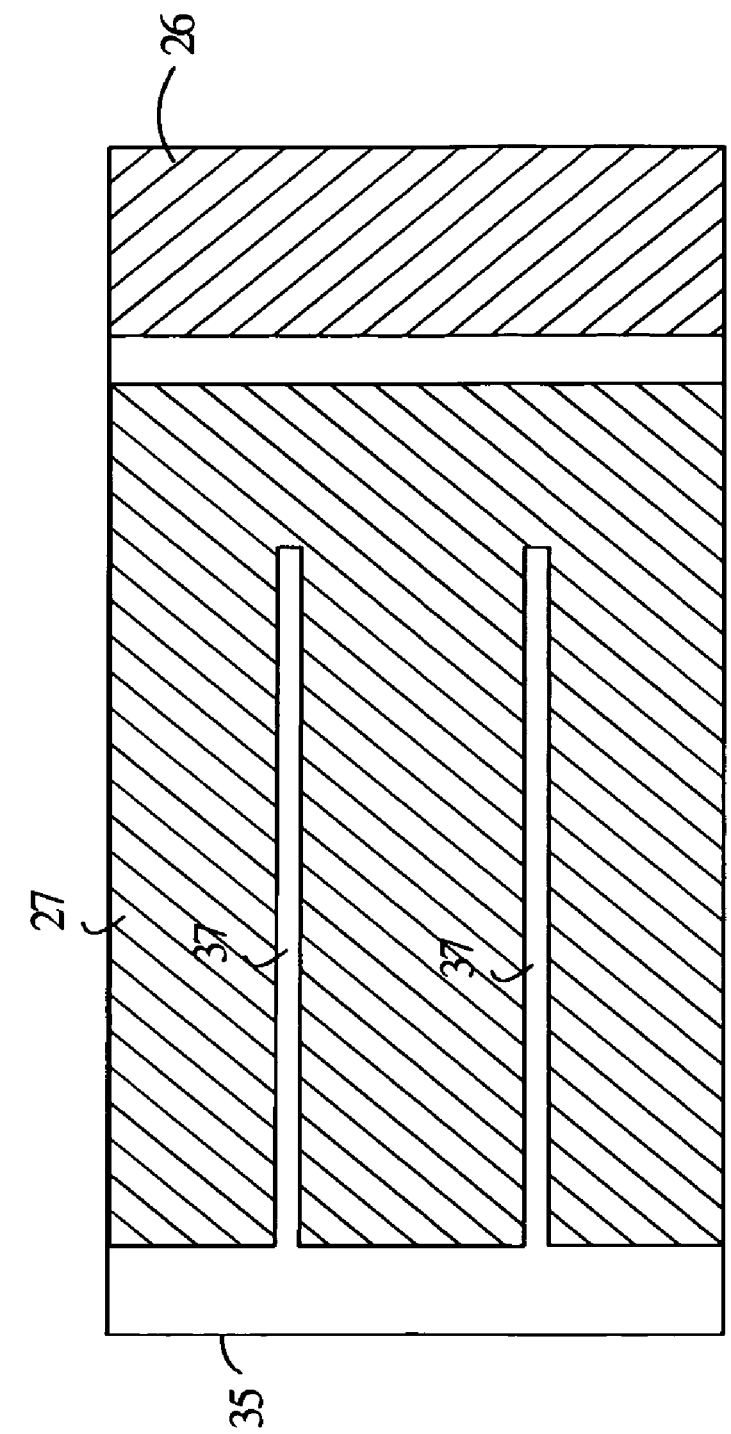
FIG. 3 is a top view of another embodiment of an LED that has been proposed to reduce the voltage drops across an electrical conductive and optical transparent or semi-transparent layer.

One prior art method for reducing the voltage drop across the ITO layer utilizes a top contact that has narrow metal members that extend out over the ITO layer. Refer to FIG. 3, which is a top view of another aspect of an LED that has been proposed to reduce the voltage drops across the ITO layer. LED 30 differs from LED 20 discussed above in that contact 25 has been replaced by a contact 35 that includes metal "fingers" 37 that extend out over the ITO layer 27. The fingers 37 assure that every point on the ITO layer is no more than some predetermined maximum distance from a metal conductor, and hence, the problems associated with voltage drops across the ITO layer are substantially reduced.

Unfortunately, this solution significantly reduces the amount of light that leaves the LED. The fingers must have widths that are sufficient to conduct the current that is being spread by the ITO layer without a significant voltage drop along the fingers. As a result, a significant fraction of the ITO layer surface is covered by metal, and hence, does not transmit light. Refer now to FIGS. 4-7, which illustrate an LED 40 that utilizes one aspect of the present invention. FIG. 4 is a top view of LED 40, and FIGS. 5-7 are cross-sectional views of LED 40 through lines 5-5, 6-6, and 7-7, respectively. LED 40 includes the conventional 3-layer structure 45 discussed above. Layers 45 are fabricated on a substrate 46 in the conventional manner. An ITO layer 43 is deposited over p-layer 48 to provide current spreading over layer 48. ITO layer 43 differs from ITO layer 27 discussed above in that ITO layer 43 includes sections 44 that are substantially thicker than the other portions of ITO layer 43. These thicker sections provide the current spreading function of the "fingers" discussed above while blocking less light generated in the region below the sections. The ITO layer is connected to a metal contact 41, and the LED is powered by applying power between contacts 41 and 42.

The thicker regions absorb more light than the thinner regions; however, the net light throughput is still increased. In addition, the thickness of the thinner portions of ITO layer 43 can be reduced, since these portions no longer need to transport current over long distances. As a result, the light absorption in the thinner portions is reduced. Given any particular pattern of fingers, the optimum thickness of the thin and thick portions of ITO layer 43 can be obtained for the current density that the LED is to carry. The optimum height, width, and length of the fingers, as well as the thickness of the thin portions of ITO layer 43 are determined by minimizing the total light absorption in the ITO layer for the desired current density, maximum allowed variation in current density across the LED and design parameters of the LED such as overall size and resistivity of layer stack 45.

Referring back to FIG. 7, ITO layer 43 includes thick regions 906 and thin regions 908, wherein the height of thin regions is designated as d1 and the height of thick regions is designated as d2. In one aspect, d1 has a range from 5 Å to 4999 Å, and d2 has a range from 5 to 5000 Å. The width of thick or thin regions d3 has a range from 1 to 1000 μm depending upon the size of the device and the materials used. It should be noted that varying, altering, or adjusting dimensions of d1, d2, and d3 can be a tradeoff function between current spreading and light passage.

To optimize the tradeoff between current spreading and light passage, one aspect of the present invention employs a patterned conductive layer to improve overall light output. The patterned conductive layer is an electrical conductive and optical transparent or semi-transparent layer with regular and/or irregular shaped surface patterns. The electrical conductive and transparent or semi-transparent layer, in one aspect, is an ITO layer with various patterns or shapes to create thick regions and thin regions. As mentioned earlier, the thick regions facilitate current spreading while the thin regions facilitate light passage. The electrical conductive and transparent or semi-transparent layer is formed with a pattern, wherein the pattern includes one or more shapes. The shapes can be regular and/or irregular geometric shapes, wherein geometric shapes include, but not limited to, polygon, triangle, parallelogram, rectangle, rhombus, square, trapezium, quadrilateral, ploydrafter, circle, and/or a combination of different geometric shapes. The following five figures (FIG. 8 through FIG. 12) illustrate exemplary aspects of patterns formed by different shapes.

Figure 8:
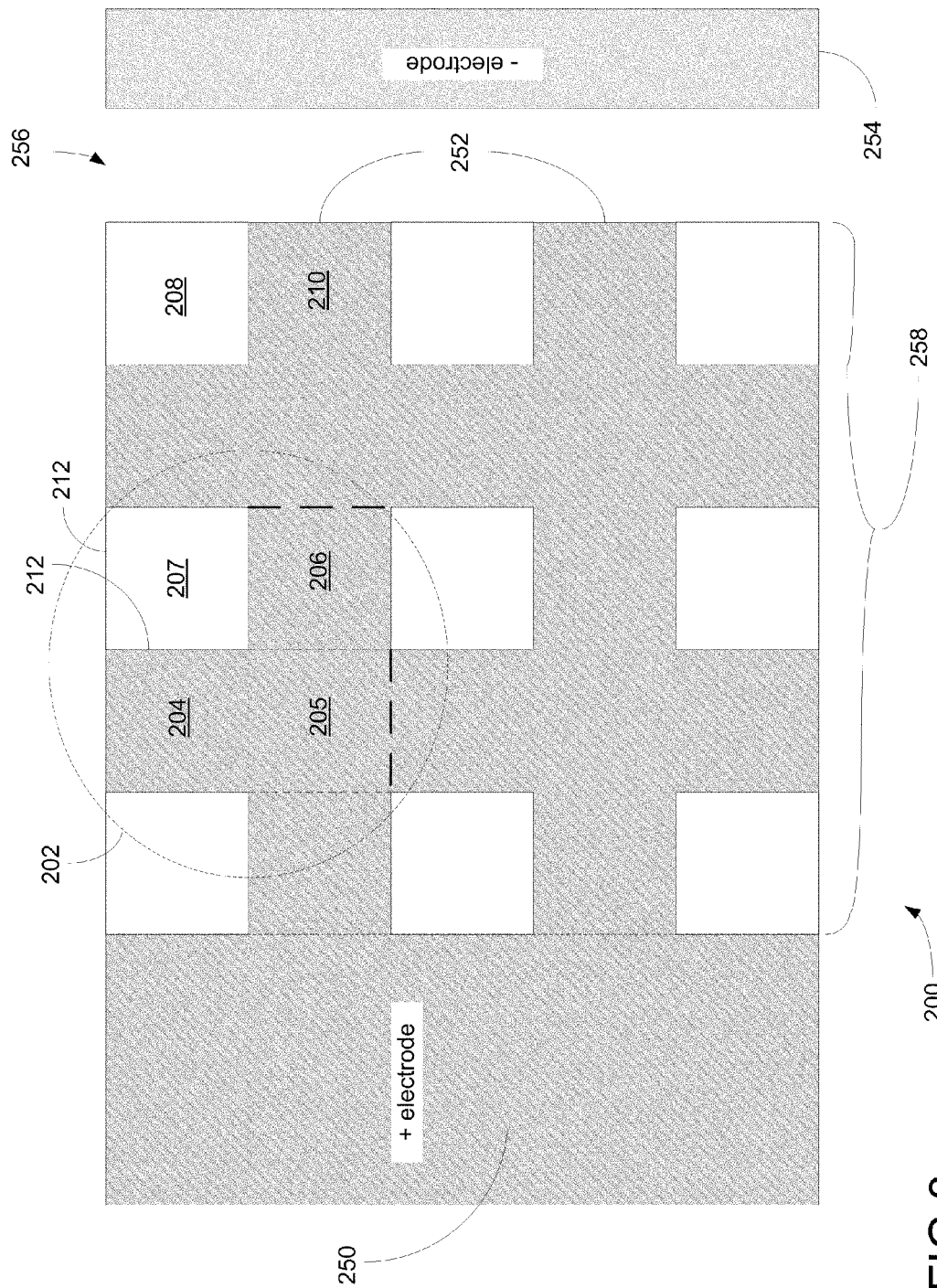
FIG. 8 is a diagram illustrating an electrical conductive and optical transparent or semi-transparent layer having a square shaped pattern with thick regions and thin regions in accordance with one aspect of the present invention.

FIG. 8 is a diagram 200 illustrating an exemplary electrical conductive and optical transparent or semi-transparent layer having a square shaped pattern with thick regions and thin regions in accordance with one aspect of the present invention. Diagram 200 includes a positive electrode 250, a negative electrode 254, and an electrical conductive and optical transparent or semi-transparent layer 258. Electrical conductive and optical transparent or semi-transparent layer 258 is an ITO layer, which covers at least a portion of the surface of LED, includes multiple patterns 202, wherein each pattern 202 includes four squares 204-207. Note that patterns 202 can be repeated over a portion of ITO layer 258. In an alternative example, several different patterns may be repeated over a portion of ITO layer 258. In an aspect, squares 207 and 208 are thin regions while squares 204-206 and 210 are thick regions, wherein each square has four (4) sides 212.

Sides 212 of thin region 207 have similar dimension with sides of thick region 210. Depending upon the ITO materials used, the length of side 212 can be adjusted to optimize current flow as well as light passage. The light passage means the amount of visible light or electromagnetic radiation having a wavelength between 50-2000 nm (nanometer) passing through the ITO layer. With a patterned ITO layer, thin regions 207-208 allows more light to pass than thick regions 204-206.

ITO layer 258, capable of spreading current flow, is a separate layer in an LED core, wherein the LED core includes, but not limited to, an n-layer, p-layer, and active region. In an aspect, the size or area of each square can be adjusted to optimize the light output. For example, the length of sides 212 can be altered between 1 and 100 μm. Because thin regions (or square) 208 allow additional light passage, higher percentage of thin squares 208 renders brighter optical device. Since pattern 202 includes three (3) squares 204-206 of thick regions and one (1) square 207 of thin region, ITO layer 258, as illustrated in FIG. 8, uses approximately 25% of area for light passage improvement. Note that increasing the size of thick regions or reducing the size of thin regions is a tradeoff between current flow and light passage. For example, increasing in size of thick ITO regions, which allows additional current flow, reduces light passage.

In one aspect, thick regions 252 of ITO layer 258 perform functions as metal fingers 37 shown in FIG. 3 for current spreading including thin regions 207-208. Similarly, thin regions 207-208 allow more visible light to pass through ITO layer 258. ITO layer 258 or a portion of ITO layer 258 is coupled to positive electrode 250 such as p-electrode. Mesa or well 256 separates ITO layer 258 from negative electrode 254 such as an n-electrode. It should be noted that ITO layer 258 can be replaced by another conductive layer having a pattern of polygons or a combination of different types of shapes.

The electrical conductive and transparent or semi-transparent layer such as ITO layer 258 is capable of conducting or distributing electrical current as well as allowing light to pass through the layer 258. The electrical conductive and optical transparent or semi-transparent layer can also be formed by compound materials other than ITO. It does not alter the underlying concept of the aspect(s) of invention if ITO layer 258 is replaced by another electrical conductive and transparent or semi-transparent layer such as a layer of carbon nanotube.

Figure 9:
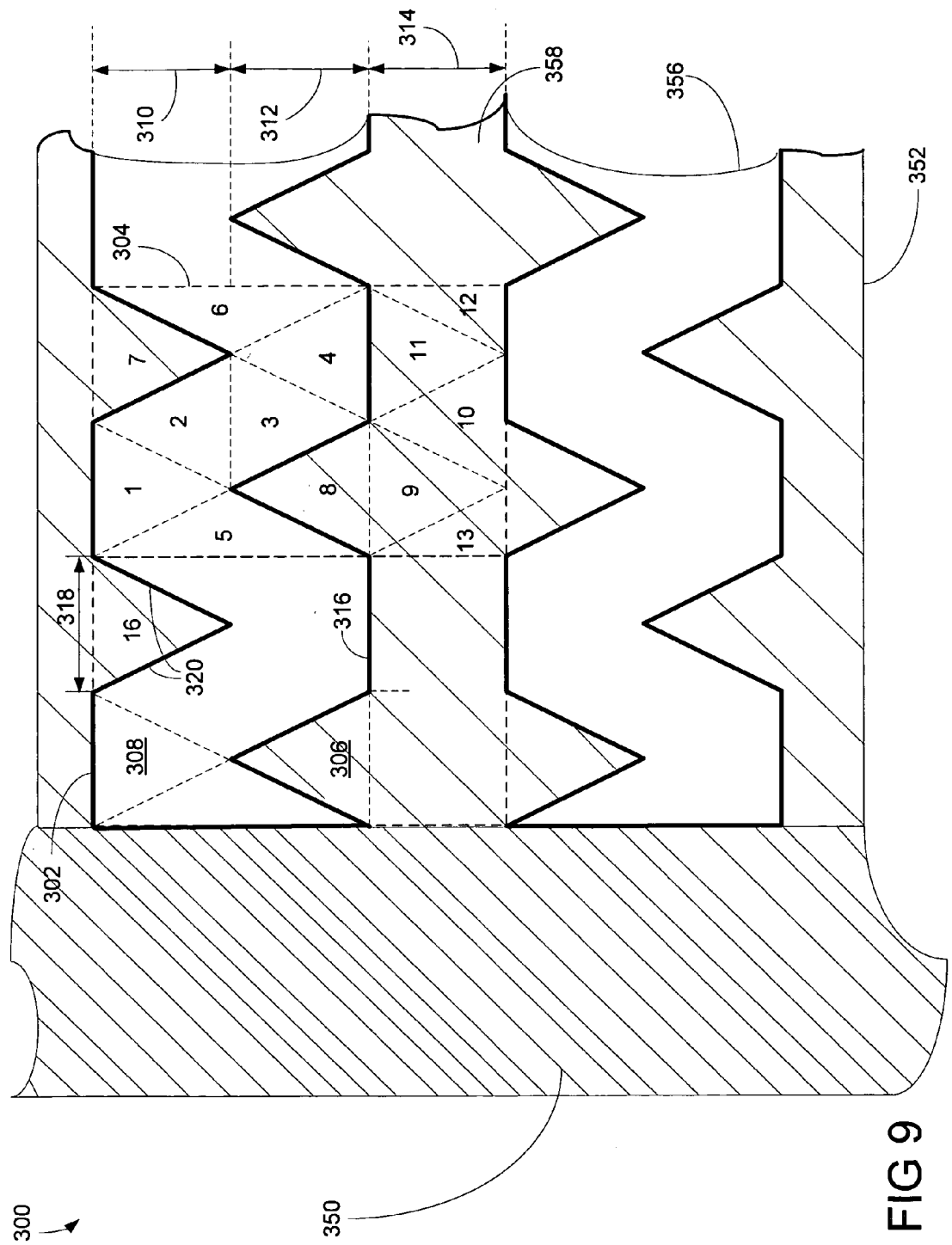
FIG. 9 is a diagram illustrating an electrical conductive and optical transparent or semi-transparent layer organized in a triangular pattern with thick regions and thin regions in accordance with one aspect of the present invention.

FIG. 9 is a diagram 300 illustrating an electrical conductive and optical transparent or semi-transparent layer 352 organized in a triangular pattern having thick regions and thin regions in accordance with one aspect of the present invention. Diagram 300 includes an electrode 350 and electrical conductive and optical transparent or semi-transparent layer 352, wherein layer 352 includes thick regions 358 and thin regions 356. Electrical conductive and optical transparent or semi-transparent layer 352 is an ITO layer which includes multiple triangular patterns such as pattern 304 across the entire surface of ITO layer 352. Each pattern 302 or 304 includes approximately thirteen (13) triangles wherein triangles 12 and 13 are half the size of other triangles such as triangle 11. Triangles in thick regions, known as thick triangles, have similar physical dimensions as triangles in thin regions, known as thin triangles. In an aspect, pattern 304 includes six (6) thin triangles 1-6 and seven (7) thick triangles 7-13. It should be noted that the underlying concept of the exemplary aspect(s) of the present invention would not change if one or more blocks (or layers) were added to or removed from diagram 300.

A triangle such as triangle 16 has two (2) edges 320, one (1) side 318, and a height 310, wherein height 310 can have similar dimension as base 318. Triangles 12 and 13 are half triangles which have approximately half the area of other triangles. Edges and/or sides 310-320 of thin and thick triangles are approximately the same physical dimensions. Depending upon the ITO materials, the dimension of edges and/or sides 310-320 can be adjusted to optimize current flow as well as light passage. In one aspect, the length of edges or sides 310-320 can be set to a number anywhere between 1 to 100 μm (micrometers). For example, the length of side 310 or 318 can be set to five (5) μm. Because thin triangles 308 are more efficient for light passage, higher percentage of thin triangles such as triangle 308 renders brighter optical device. Since pattern 304 includes six (6) thin triangles 1-6 and seven (7) thick triangles 7-13 wherein triangles 12-13 are half triangles, the total thin regions of pattern 304 is approximately 50%. It should be noted that pattern 304 can be repeated from the left to the right and from top to bottom as illustrated by FIG. 9. Pattern 302 or 304 offers an offset design that is beneficial to current spreading.

In one aspect, thick regions 358 of ITO layer 358 perform functions as metal fingers 37 shown in FIG. 3 for current spreading including. Similarly, thin regions 207-208 allow more visible light to pass through ITO layer 358 from the bottom surface of ITO layer to the top surface of ITO layer. ITO layer 358 or a portion of ITO layer 358 is coupled to positive electrode 350 such as p-electrode. It should be noted that ITO layer 358 can be replaced by another conductive and transparent or semi-transparent layer having a polygon pattern other than triangular shapes.

The electrical conductive and transparent or semi-transparent layer such as ITO layer 352 is capable of conducting or distributing electrical current as well as allowing light to pass through the layer 352. The electrical conductive and optical transparent or semi-transparent layer can also be formed by compound materials other than ITO. It does not alter the underlying concept of the aspect(s) of invention if ITO layer 352 is replaced by another electrical conductive and transparent or semi-transparent layer such as a layer of carbon nanotube.

Figure 10:
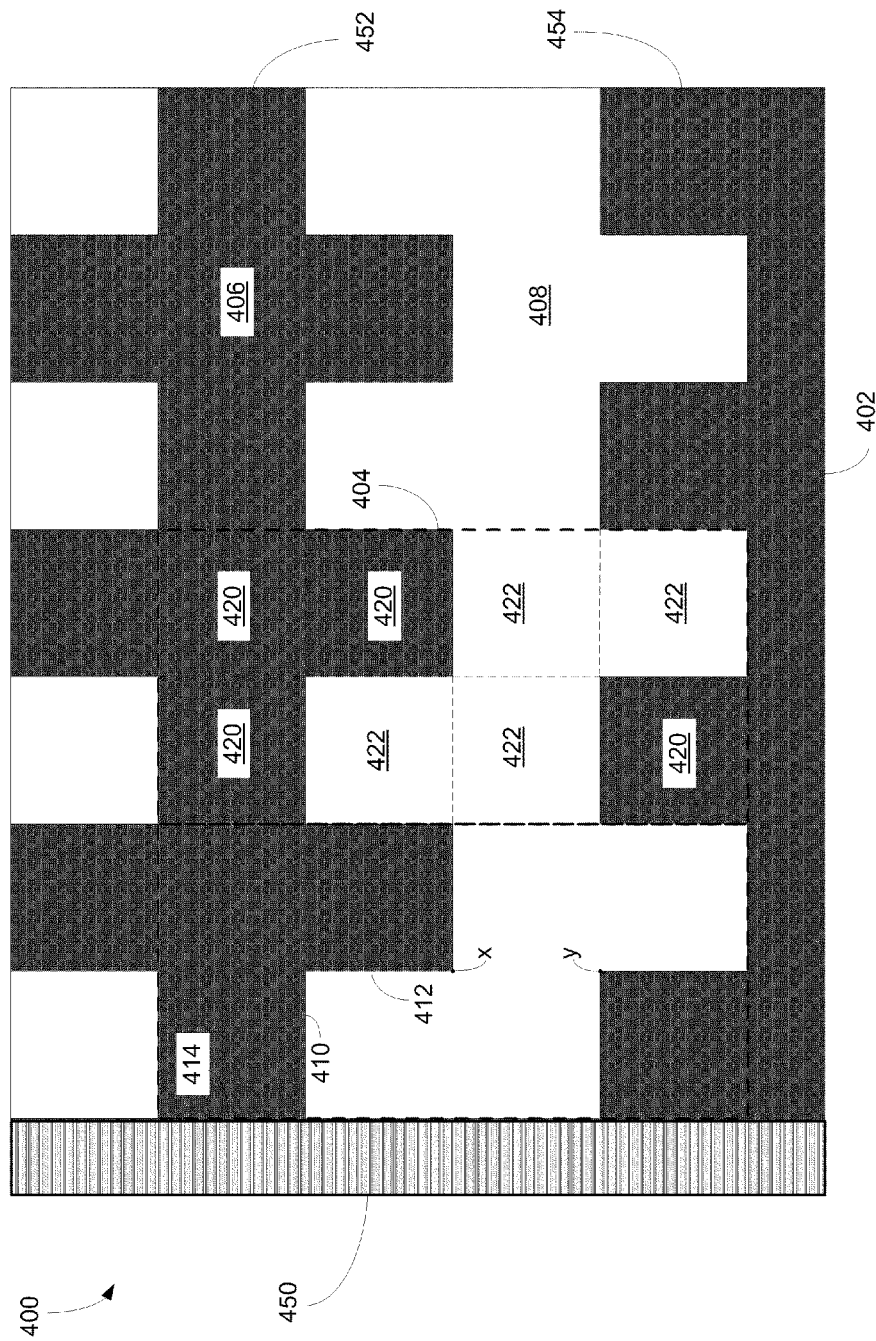
FIG. 10 is a diagram illustrating an electrical conductive and optical transparent or semi-transparent layer having a rectangular shaped pattern with multiple thick regions and thin regions in accordance with one aspect of the present invention.

FIG. 10 is a diagram 400 illustrating an electrical conductive and optical transparent or semi-transparent layer 402 having a rectangular pattern with thick regions 406 and thin regions 408 in accordance with one aspect of the present invention. Diagram 400 includes an electrode 450 and electrical conductive and optical transparent or semi-transparent layer 402. Layer 402, in an aspect, is an ITO layer, which includes multiple rectangular patterns 404 across the entire surface of ITO layer 402. Rectangular pattern 404 includes four (4) thick rectangles or square regions 420 and four (4) thin rectangle or square regions 422. It should be noted that the underlying concept of the exemplary aspect(s) of the present invention would not change if one or more blocks (or layers) were added to or removed from diagram 400.

Rectangular pattern 404 includes multiple rectangles, squares, or blocks 420-422, wherein each block 420 or 422 includes four (4) sides. Depending upon the applications, the area of block can be adjusted to optimize current flow. For example, lengths of block sides can be adjusted to a range of values between 1 and 1000 μm. Because thin rectangles or squares 422 are more efficient for light passage, a higher percentage of thin rectangles or squares 422 renders a brighter optical device. Since rectangular pattern 404 includes four (4) thick rectangles or squares 420 and four (4) thin rectangles or squares 422, rectangular pattern 404 uses approximately 50% of its area for enhancing light passage. It should be noted that rectangular pattern 404 can be repeated from the left to the right and from top to bottom as illustrated by FIG. 10. Rectangular pattern 404 offers an offset design that is beneficial to current spreading.

In one aspect, thick regions 406 of ITO layer 402 perform functions as metal fingers 37 shown in FIG. 3 for current spreading including thin regions 408. Similarly, thin regions 408 allow more light to pass through ITO layer 402. ITO layer 402 is coupled to positive electrode 450 such as p-electrode for initiating current flow. It should be noted that ITO layer 402 can be replaced by another conductive and transparent or semi-transparent layer having polygon patterns other than rectangular shapes.

The electrical conductive and transparent or semi-transparent layer such as ITO layer 402 is capable of conducting or distributing electrical current as well as allowing light to pass through the layer 402. The electrical conductive and optical transparent or semi-transparent layer can also be formed by compound materials other than ITO. It does not alter the underlying concept of the aspect(s) of invention if ITO layer 402 is replaced by another electrical conductive and transparent or semi-transparent layer such as a layer of carbon nanotube.

Figure 11:
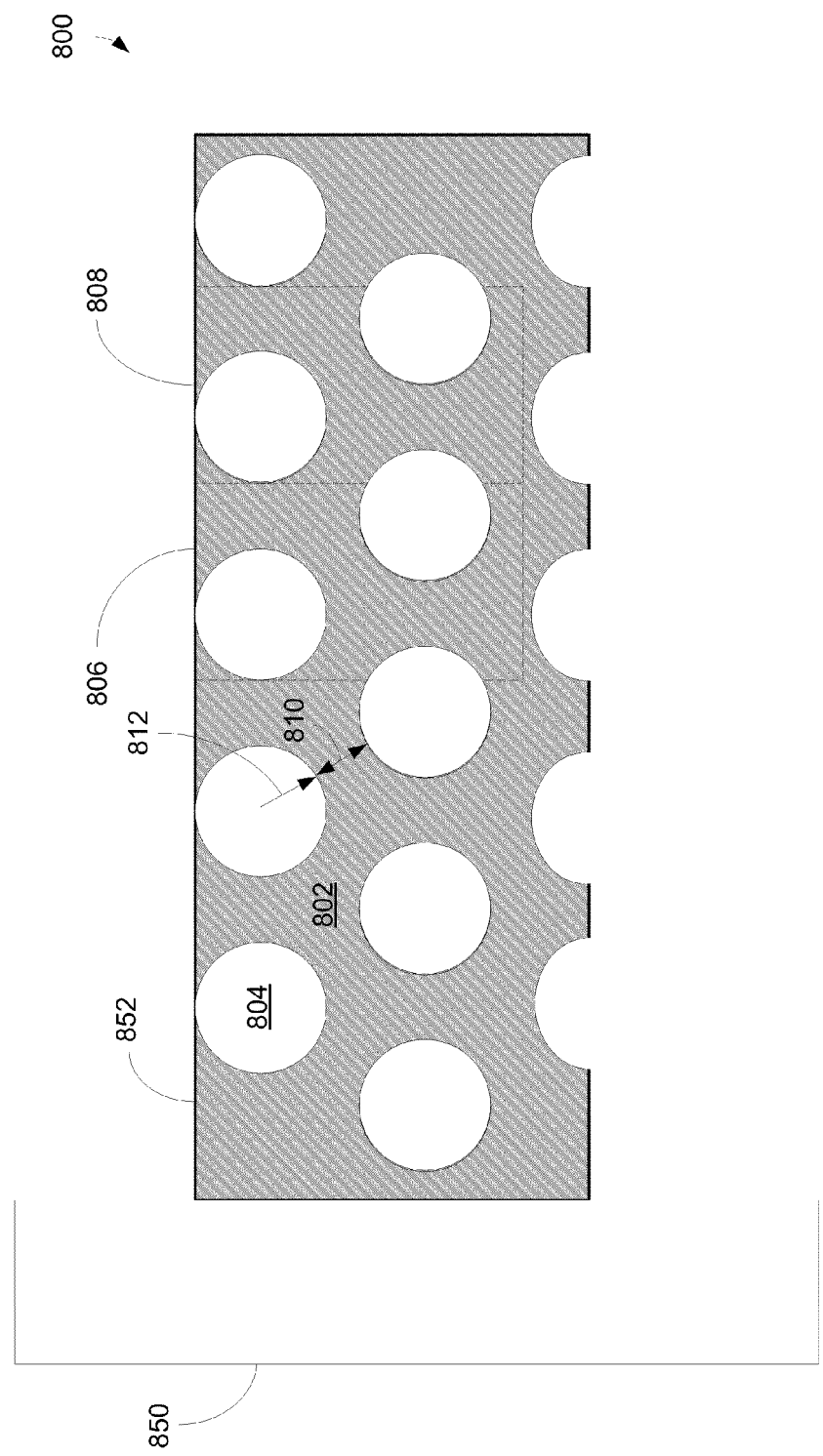
FIG. 11 is a diagram illustrating an electrical conductive and optical transparent or semi-transparent layer having a circular pattern with thick regions and thin regions in accordance with one aspect of the present invention.

FIG. 11 is a diagram 800 illustrating an electrical conductive and optical transparent or semi-transparent layer 852 having a circular pattern with thick regions 802 and thin regions 804 in accordance with one aspect of the present invention. Diagram 800 includes an electrode 850 and electrical conductive and optical transparent or semi-transparent layer 852. Layer 852, in an aspect, is an ITO layer, which further includes multiple circular patterns 806-808 across the entire surface of ITO layer 852. Circular pattern 806 or 808 includes at least one thick region 802 and one thin region 804. Electrode 850, in one example, is a contact capable of coupling to a positive voltage potential for initiating a current flow. It should be noted that the underlying concept of the exemplary aspect(s) of the present invention would not change if one or more blocks (or patterns) were added to or removed from diagram 800.

In an aspect, ITO layer 852 is deposited over at least a portion of the top layer of an LED for current spreading. ITO layer 852 can be organized in various circular patterns 806 or 808 wherein each circular pattern 806 or 808 includes at least one thin region such as thin region 804 for facilitating light passage. A function of thick regions 802 is to spread or distribute current flow from p-type electrode to n-type electrode. Thin regions 804 improve light passage from the active layer, not shown in FIG. 11, to the surface of ITO layer 852. As mentioned earlier, an electrical conductive and transparent or semi-transparent layer such as ITO layer 852 is capable of distributing electrical current and facilitating light passage. It should be noted that it does not alter the underlying concept of the aspect(s) of present invention if ITO layer 852 is replaced by another type of electrical conductive and transparent layers such as a carbon nanotube layer.

Depending upon the materials used for ITO layer 852, the size of thin region 804 may vary to optimize the light output. For example, a radius 812 of thin region 804 can be set to a desirable value to maximize current flow as well as light passage. Radius 812 can be set to a value having a range from 1 to 1000 μm depending on the materials used for ITO layer 852. Radius 812 of a thin region 804, for instance, can be set to five (5) μm for certain ITO materials. Since thin regions or circles 804 facilitate additional light passage, higher percentage of thin circles 804 renders brighter optical device. In an aspect, the total area of thin regions 804 in a circular pattern occupies approximately 50% of the total area of ITO layer 852.

Thick regions 802 of ITO layer 852, for instance, perform functions as metal fingers 37 shown in FIG. 3 for current spreading. Similarly, thin regions 804 allow more light to pass through ITO layer from the active layer to the surface of the LED device. ITO layer 852 facilitates current flow from positive electrode such as electrode 850 to a negative electrode, not shown in FIG. 11. It should be noted that ITO layer 852 can be replaced by another conductive and transparent layer with polygon patterns other than circles.

The electrical conductive and transparent or semi-transparent layer such as ITO layer 852 is capable of conducting or distributing electrical current as well as allowing light to pass through the layer 852. The electrical conductive and optical transparent or semi-transparent layer can also be formed by compound materials other than ITO. It does not alter the underlying concept of the aspect(s) of invention if ITO layer 852 is replaced by another electrical conductive and transparent or semi-transparent layer such as a layer of carbon nanotube.

Figure 12A:
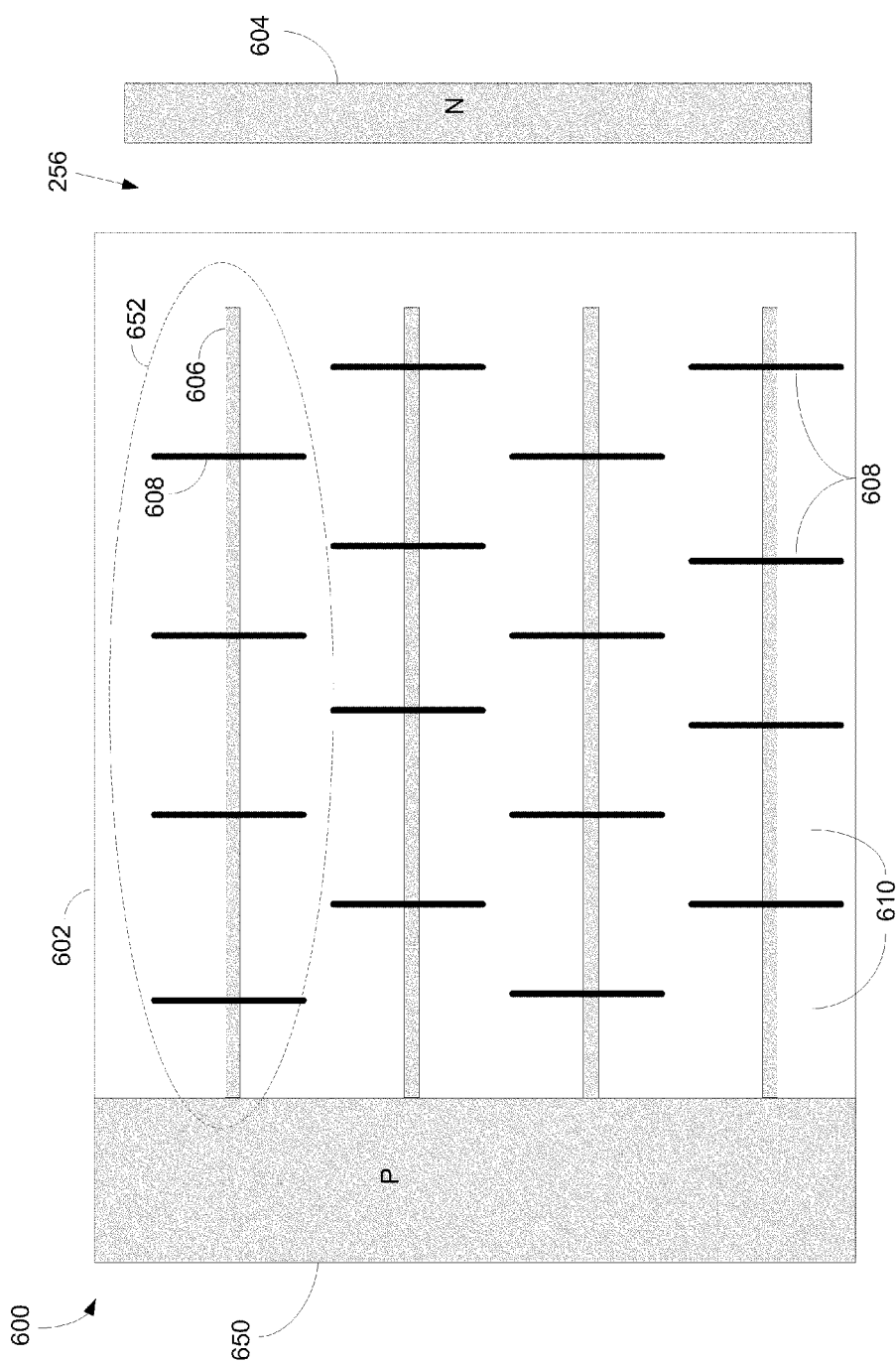
FIGS. 12A-B are diagrams illustrating electrical conductive and optical transparent or semi-transparent layers having mesh patterns in accordance with one aspect of the present invention.

FIG. 12A is a diagram 600 illustrating an electrical conductive and optical transparent or semi-transparent layer 602 having a mesh pattern in accordance with one aspect of the present invention. Diagram 600 includes a positive electrode 650, a negative electrode 604, and an electrical conductive and optical transparent or semi-transparent layer 602. Layer 602, in an aspect, is an ITO layer, which includes multiple repeated mesh patterns 652, wherein each mesh pattern 652 includes at least one finger region 606. Each finger region 606 further includes multiple hair regions 608. Regions are used to spread current flow from positive electrode 650 to negative electrode 604 via finger region 606, hair region 608, and thin region 610. It should be noted that the underlying concept of the exemplary aspect(s) of the present invention would not change if one or more blocks (or patterns) were added to or removed from diagram 600.

Each mesh pattern 652, in an aspect, includes a finger region 606 and multiple hair regions 608 wherein regions are made of thick ITO materials. Depending on ITO materials, the length of finger region 606 and hair regions 608 can be adjusted to optimize current flow. While regions 606-608 provide current passage, the space between these thick regions or thin regions 610 provide light passage. In one aspect, hair regions 608 on each finger region 606 are evenly spaced. In addition, hair regions 608 between different finger regions 606 are placed in alternate positions with respect to neighboring hair regions as illustrated in FIG. 12A. In another aspect, number of hair regions 608 along finger region 606 can have different shapes. For example, hair regions 608 can have shapes including straight line, curved line, angled line, and the like. Note that depending on the applications, the length of hair region 608 can be adjusted between finger regions 606. It should be noted that the location of regions is not limited to where it is shown in FIG. 12A.

Finger regions 652 of ITO layer 602 are thick regions capable of performing similar functions as metal fingers 37 shown in FIG. 3 for current spreading. Similarly, thin regions 610 allow more light to pass through ITO layer 602 from the active layer to the surface of the LED device. ITO layer 602 is coupled to positive electrode 650 such as p-region for facilitating current flow. Mesa or well 256 is used to separate ITO layer 602 from negative region such as electrode 604. It should be noted that ITO layer 602 can be replaced by another conductive and transparent or semi-transparent layer with a pattern other than a mesh pattern.

The electrical conductive and transparent or semi-transparent layer such as ITO layer 602 is capable of conducting or distributing electrical current as well as allowing light to pass through the layer 602. The electrical conductive and optical transparent or semi-transparent layer can also be formed by compound materials other than ITO. It does not alter the underlying concept of the aspect(s) of invention if ITO layer 602 is replaced by another electrical conductive and transparent or semi-transparent layer such as a layer of carbon nanotube.

Figure 12B:
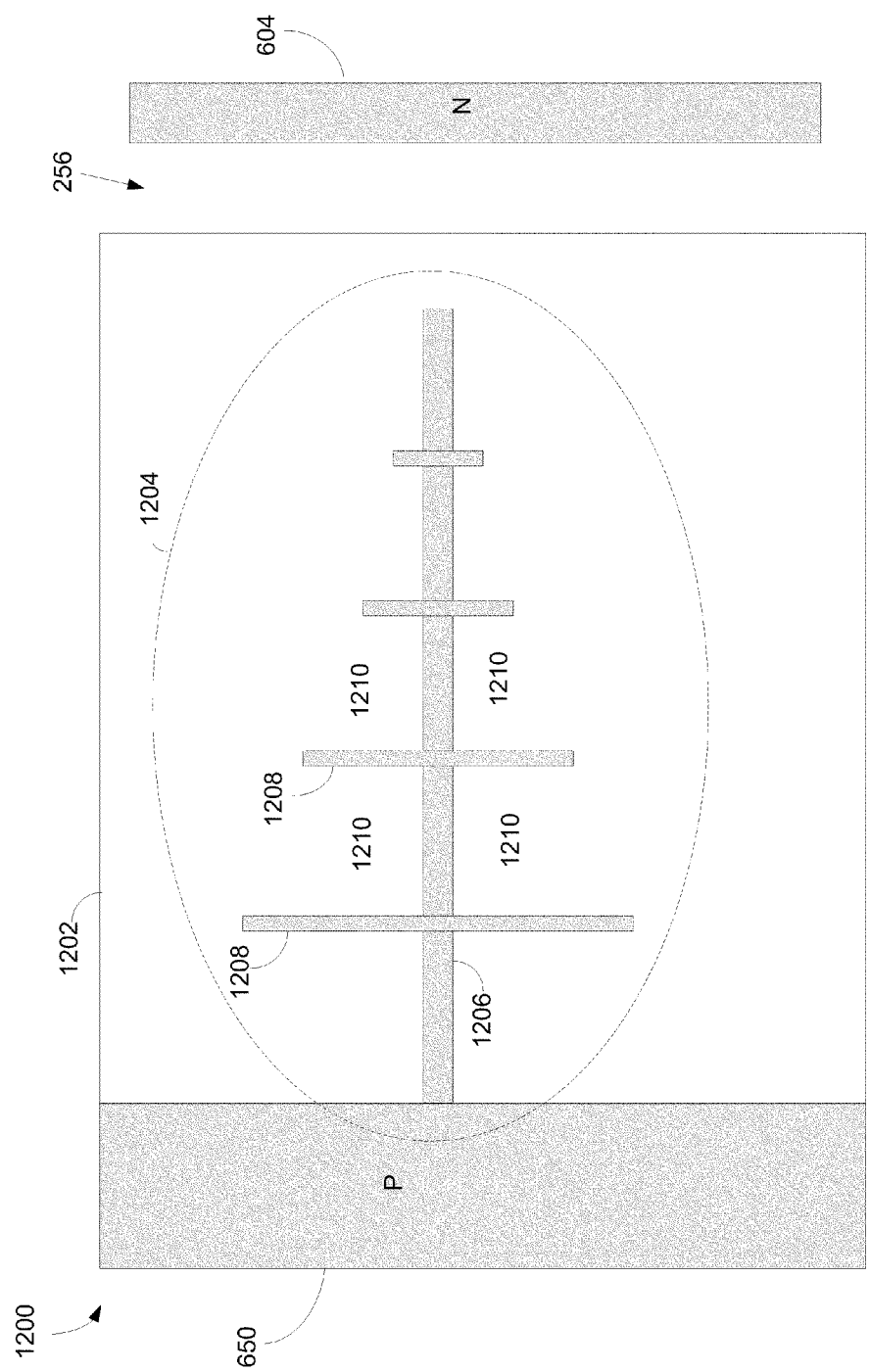

FIG. 12B is a diagram 1200 illustrating an electrical conductive and optical transparent or semi-transparent layer 1202 having a mesh pattern arranged a Christmas-tree shape in accordance with one aspect of the present invention. Diagram 1200 includes a positive electrode 650, a negative electrode 604, and an electrical conductive and optical transparent or semi-transparent layer 1202. Layer 1202 is an ITO layer which includes a mesh pattern having a Christmas-tree shape 1204, wherein each Christmas-tree shape 1204 includes at least one finger region 1206. Each finger region 1206 further includes multiple hair regions 1208 wherein hair regions 1208 have different lengths. Hair regions 1208 are arranged in such a way thereby hair regions 1208 located closer to well 256 are shorter than hair regions 1208 located farther away from well 256. Regions are used to spread current flow from positive electrode 650 to negative electrode 604 via finger region 1206, hair region 1208, and thin region 1210. Depending on the applications, finger regions 1206 and hair regions 1208 can have different lengths, thicknesses, shapes, and/or designs.

Finger regions 1206 together with hair regions 1208 are thick regions capable of performing similar functions as metal fingers 37 shown in FIG. 3 for current spreading. Similarly, thin regions 1210 allow more light to pass through ITO layer 1202 from the active layer to the surface of the LED device. ITO layer 1202 is coupled to positive electrode 650 such as p-electrode for facilitating current flow. Mesa or well 256 is used to separate ITO layer 1202 from negative electrode such as electrode 604. It should be noted that ITO layer 1202 can be replaced by another conductive and transparent or semi-transparent layer with a pattern other than a pattern with a Christmas-tree shape.

The electrical conductive and transparent or semi-transparent layer such as ITO layer 1202 is capable of conducting or distributing electrical current as well as allowing light to pass through the layer 1202. The electrical conductive and optical transparent or semi-transparent layer can also be formed by compound materials other than ITO. It does not alter the underlying concept of the aspect(s) of invention if ITO layer 1202 is replaced by another electrical conductive and transparent or semi-transparent layer such as a layer of carbon nanotube.

Figure 13A:
FIGS. 13A-B illustrate a fabrication process for manufacturing an LED device with a patterned electrical conductive and optical transparent or semi-transparent layer in accordance with one aspect of the present invention.
Figure 13A:
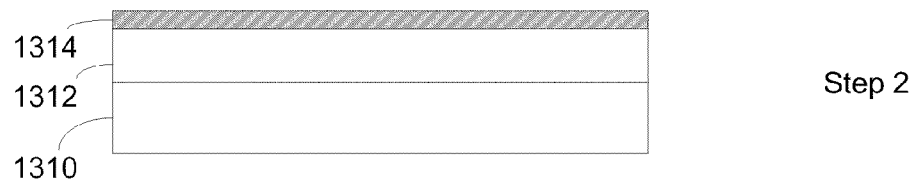
Figure 13A:
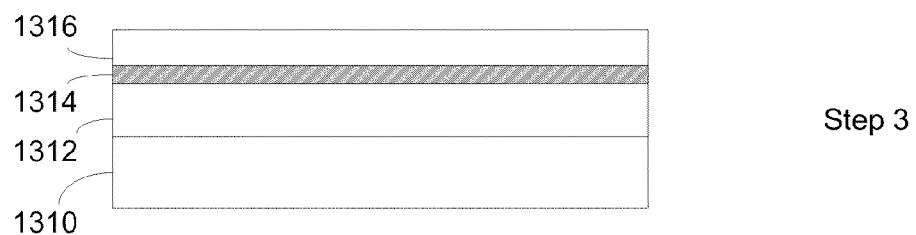
Figure 13B:
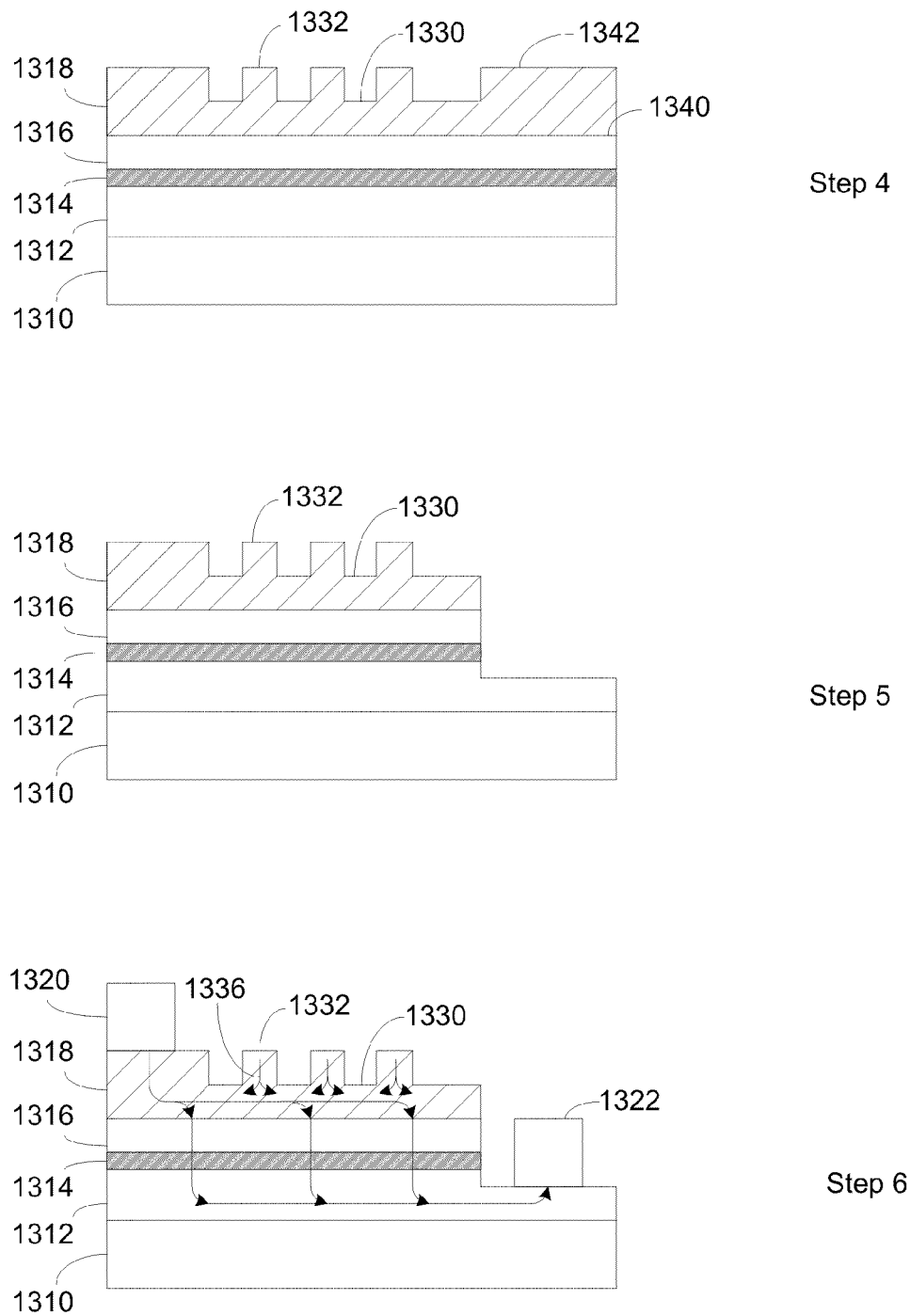

FIGS. 13A-B illustrate a fabrication process for manufacturing an LED device with a patterned electrical conductive and optical transparent or semi-transparent layer in accordance with one aspect of the present invention. The fabrication process of an LED device includes a series of steps carried out in an order, wherein the steps transfer a circuit design into an operable LED chip. At step 1, a process deposits a layer 1312 of n-type material over a substrate 1310. For instance, substrate 1310 can be a sapphire substrate while layer 1312 can be a GaN layer. Substrate is the base material or other surface upon which something is deposited, etched, attached or otherwise prepared or fabricated. A substrate also provides physical support. It should be noted that layer 1312 is formed from any combination of, but not limited to, indium, gallium, aluminum, and nitrogen.

At step 2, the process deposits an active layer 1314 over layer 1312, wherein active layer is a functional region wherein injected electrons and holes recombined to generate photons in an LED when current is applied. It should be noted that a layer can be a film made of a specific composition of chemical elements and a specific doping concentration. The boundaries of a layer can be defined by a change in either the material composition or the doping concentration (or both) during the epitaxial growth of the fabrication process. Layers 1312-1314 can include multiple sub-layers, not shown in FIG. 13A, to perform additional and/or necessary functions.

At step 3, the process deposits a layer 1316 of p-type material over active layer 1314. It should be noted that layer 1316 is formed from a group of materials including, but not limited to, indium, gallium, aluminum, and nitrogen. For example, layer 1316 can be form in accordance with the following formula:

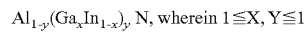

$Al_{1-y}(Ga_xIn_{1-x})_y N$, wherein $1 \leq X, Y \leq 1$

FIG. 13B illustrates next processing steps of fabricating an LED device with a patterned electrical conductive and optical transparent or semi-transparent layer. At step 4, the process deposits a layer 1318 of spreader which can be an electrical conductive and optical transparent or semi-transparent layer for current spreading. Layer 1318 can be an ITO spreader that is capable of spreading electrical current laterally in a direction parallel to the LED layers. In an aspect, layer 1318, which can be an ITO layer, includes two surfaces or surfaces 1340-1342, wherein a first surface 1340 overlies layer 1316 while a second surface 1342 contains a pattern. A pattern having thick regions 1332 and thin regions 1330 is etched on the second surface of layer 1318.

At step 5, the process etched away portions of layer 1314-1318 to form a mesa or well. Depending on the materials of layers 1316-1318, the dimensions of thin regions and thick regions can be accordingly adjusted to optimize the current spreading as well as optical passage.

At step 6, the process deposits two contacts 1320-1322, wherein contact 1320 may be a p-electrode while contact 1322 may be an n-electrode. During operation, a current flow is established from contact 1320 to contact 1322, wherein thick regions 1332 spread current 1336 to thin regions 1330 as well as layer 1316, as indicated by FIG. 13B. It should be noted that steps 1-6 are for illustrative purposes and additional steps between each steps such as between step 1 and 2 can be added. On the other hand, some steps, such as step 4-5, may be combined.

The exemplary aspect of the present invention includes various processing steps, which will be described below. The steps of the aspect may be embodied in machine or computer executable instructions. The instructions can be used to cause a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 14:
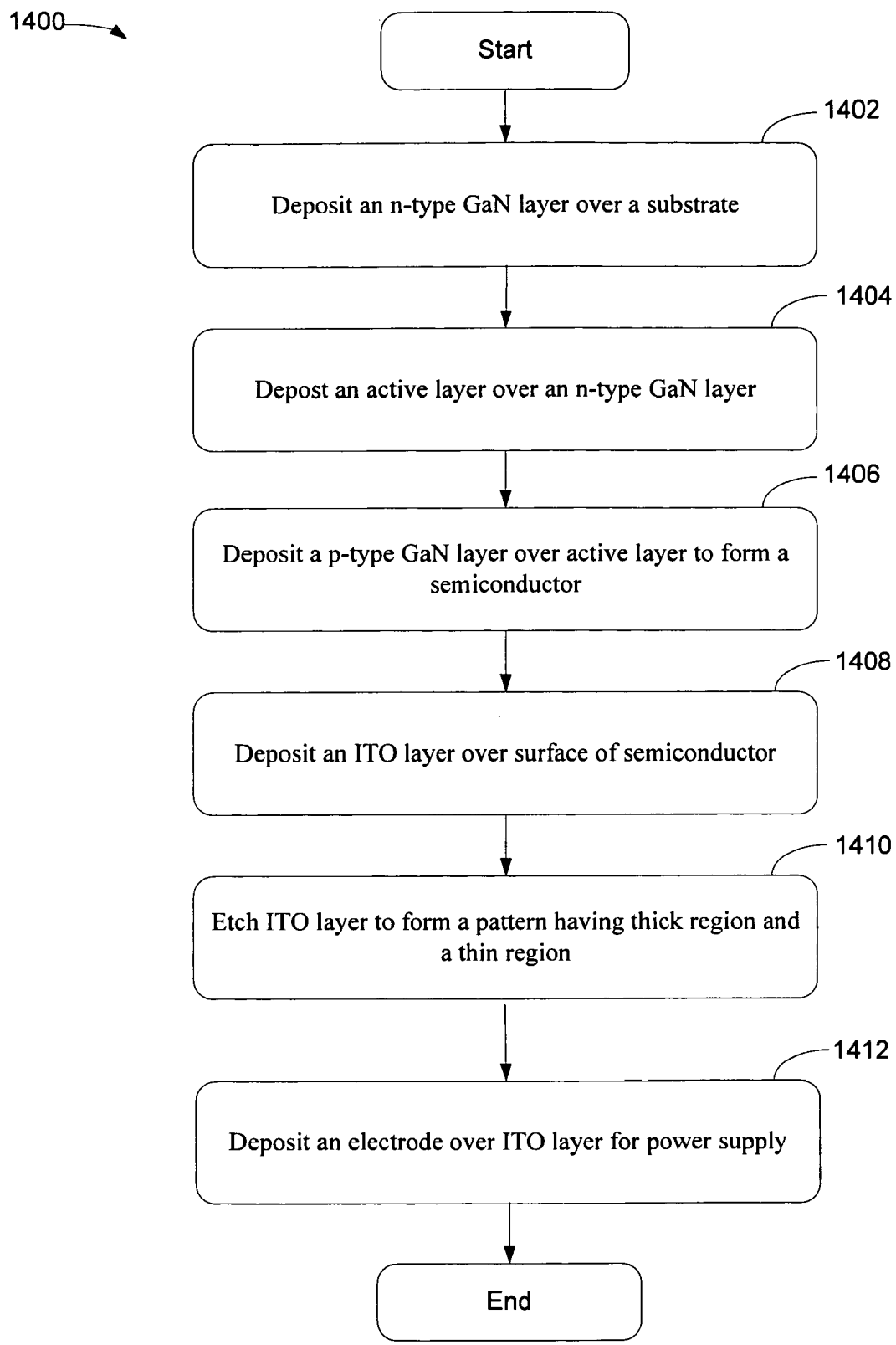
FIG. 14 is a flowchart illustrating a process of manufacturing a lighting device having a patterned electrical conductive and optical transparent or semi-transparent layer in accordance with one aspect of the present invention.

FIG. 14 is a flowchart 1400 illustrating a process of manufacturing an LED or a lighting device having a patterned ITO layer in accordance with one aspect of the present invention. At block 1402, a process deposits an n-type semiconductor layer over a substrate. The process, for example, deposits an n-type GaN layer over a sapphire substrate.

At block 1404, the process deposits an active layer over the n-type semiconductor layer, wherein the active layer is operable to convert electrical energy to light. A function of the active layer is to generate photons.

At block 1406, the process deposits a p-type semiconductor layer over the active layer to form an LED. It should be noted that the p-type semiconductor layer can be a p-type GaN layer.

At block 1408, the process deposits an electrical conductive and optical transparent or semi-transparent layer having a first surface and a second surface over the p-type semiconductor layer, wherein the first surface is overlain on the p-type semiconductor layer. The process, in an aspect, deposits an ITO layer over a p-type GaN layer. Upon removing portions of the layers, a well is formed.

At block 1410, the process etches a pattern having thick regions and thin regions on the second surface of the electrical conductive and optical transparent or semi-transparent layer. After depositing a first electrode over the second surface of the electrical conductive and optical transparent or semi-transparent layer, the process couples a positive electric potential of a power supply to the first electrode for supplying electrical current. Upon depositing a second electrode in the well, a negative potential of a power supply is coupled to the second electrode for facilitating current flow. The pattern includes thick regions and thin regions arranged in triangle, rectangle, square, circle, ellipse, trapezoid, and/or a combination of any shapes, lines, or curves.

Figure 15:
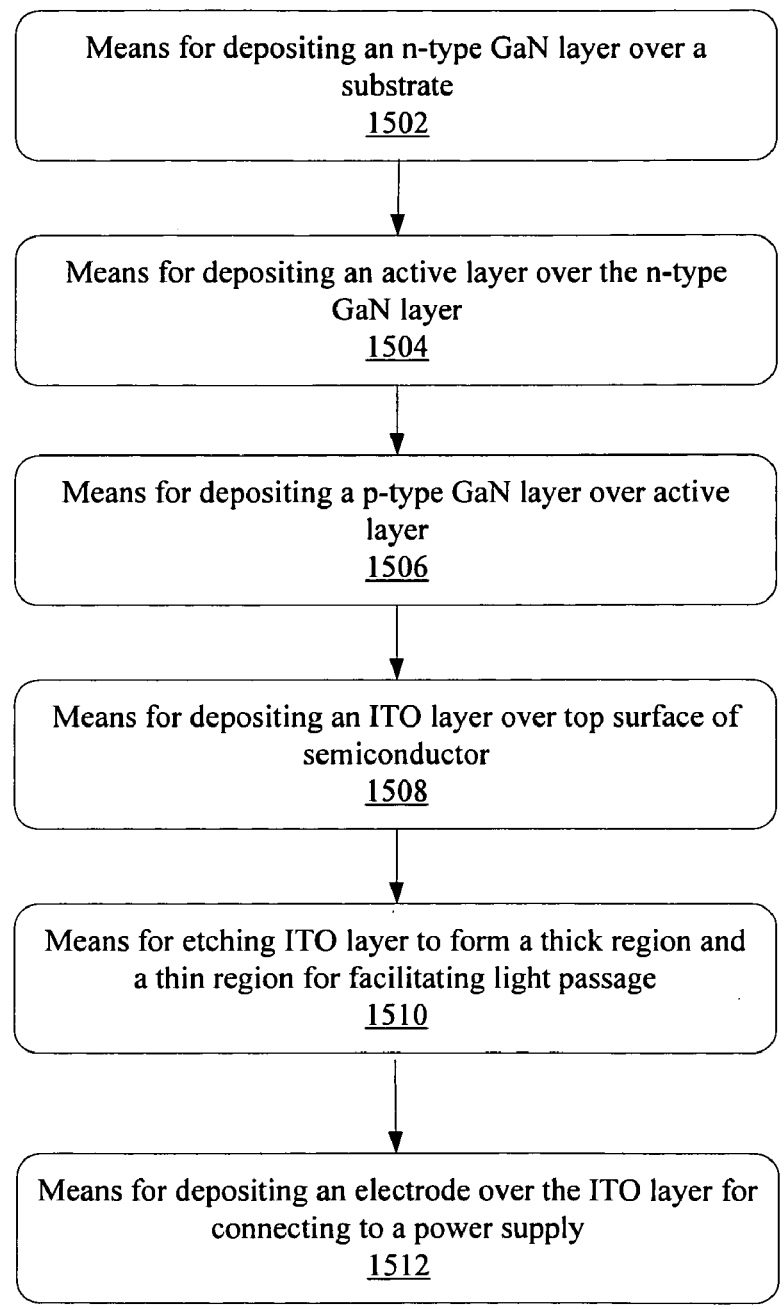
FIG. 15 is a block diagram illustrating means for manufacturing an LED device having a patterned electrical conductive and optical transparent or semi-transparent layer in accordance with one aspect of the present invention.

FIG. 15 is a logic block diagram 1500 illustrating means for manufacturing an LED or a lighting device having a patterned electrical conductive and optical transparent or semi-transparent layer in accordance with one aspect of the present invention. At block 1502, an apparatus provides means for depositing an n-type semiconductor layer over a substrate. Subsequently, the apparatus, at block 1504, provides means for depositing an active layer over the n-type semiconductor layer. The apparatus, at block 1506, continues to provide means for depositing a p-type semiconductor layer over the active layer to form an LED. At block 1508, means for depositing an electrical conductive and optical transparent or semi-transparent layer over the p-type semiconductor layer is provided. The apparatus, at blocks 1510 and 1512, provides means for etching a pattern having thick regions and thin regions, and means for depositing electrode contacts for power connection.

Figure 16:
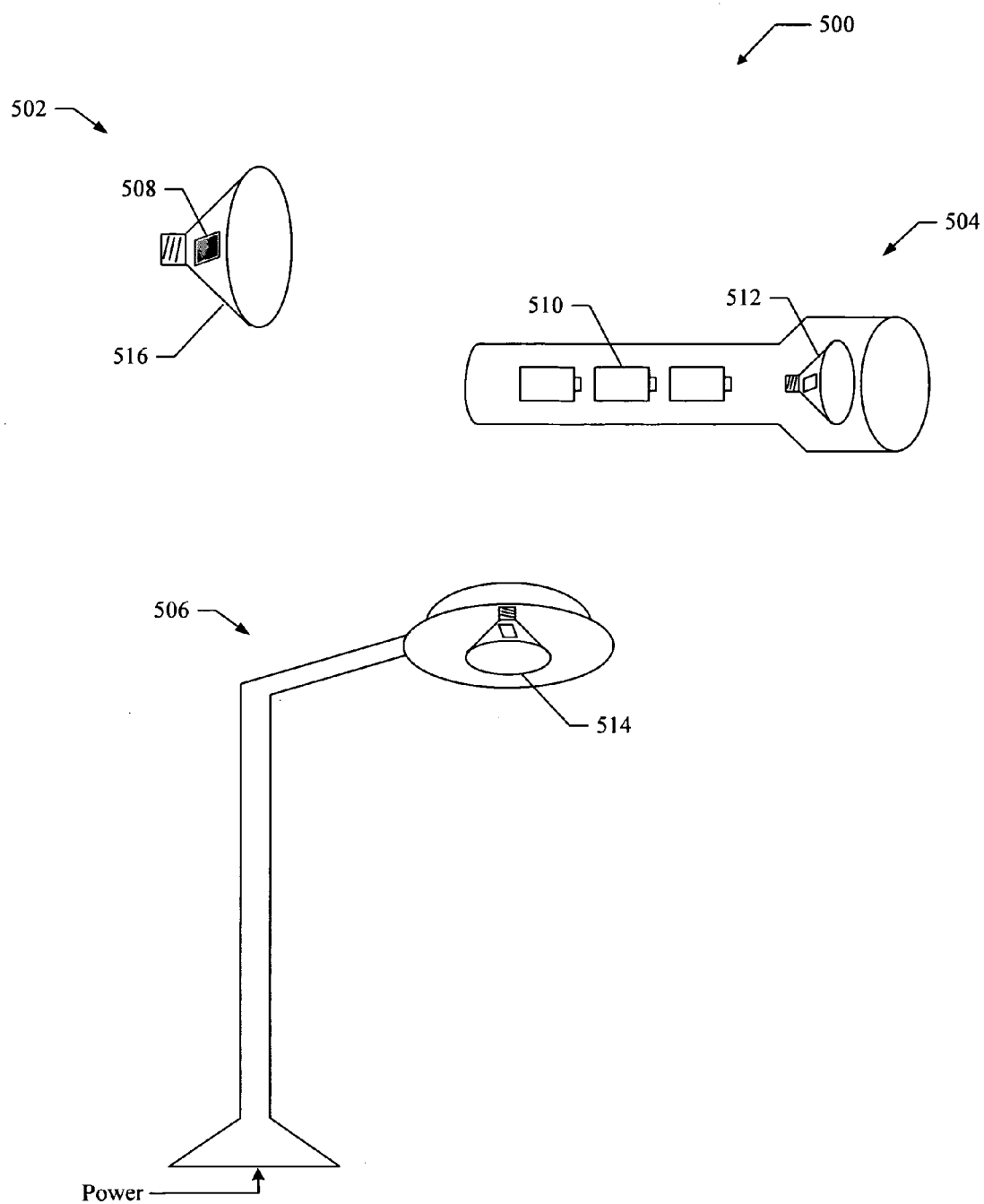
FIG. 16 shows exemplary devices including LEDs or LED devices having patterned electrically conductive and optically transparent or semi-transparent layer(s) in accordance with aspects of the present invention.

FIG. 16 shows exemplary devices 500 including LEDs or LED devices having patterned conductive layer(s) in accordance with aspects of the present invention. The devices 500 include a lamp 502, an illumination device 504, and a street light 506. Each of the devices shown in FIG. 16 includes at least an LED with a patterned conductive layer as described herein. For example, lamp 502 includes a package 516 and an LED 508, in which LED 508 includes an electrical conductive and optical transparent or semi-transparent layer. Lamp 502 may be used for any type of general illumination. For example, lamp 502 may be used in an automobile headlamp, street light, overhead light, or in any other general illumination application. Illumination device 504 includes a power source 510 that is electrically coupled to a lamp 512, which may be configured as lamp 502. In an aspect, power source 510 may be batteries or any other suitable type of power source, such as a solar cell. Street light 506 includes a power source connected to a lamp 514, which may be configured as lamp 502. In an aspect, lamp 514 includes a package and an LED that includes an electrical conductive and optical transparent or semi-transparent layer. It should be noted that aspects of the LED described herein are suitable for use with virtually any type of LED assembly, which in turn may be used in any type of illumination device and are not limited to the devices shown in FIG. 16.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other applications. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

While particular aspects of the present invention have been shown and described, it will be obvious to those of ordinary skills in the art that based upon the teachings herein, changes and modifications may be made without departing from the exemplary aspect(s) of the present invention and its broader aspects. Therefore, the appended claims are intended to encompass within their scope all such changes and modifications as are within the true spirit and scope of the exemplary aspect(s) of the present invention.

What is claimed is:

1. A device, comprising:
    a first conductive layer deposited over a substrate;
    an active layer deposited over said first conductive layer and configured to convert electrical energy to light;
    a second conductive layer having a first surface overlying said active layer and a second surface opposite to said first surface;
    an electrically conductive and optically transparent or semi-transparent layer having a first surface and a second surface, wherein said first surface of said electrically conductive and optically transparent or semi-transparent layer directly or indirectly overlies said second surface of said second conductive layer, wherein said second surface of said electrically conductive and optically transparent or semi-transparent layer includes a pattern having a plurality of pre-defined geometric shaped thick regions and a plurality of thin regions, wherein the plurality of thin regions occupies approximately fifty percent (50%) of the pattern, wherein said plurality of pre-defined geometric shaped thick regions are configured to distribute at least a portion of electric current to said plurality of thin regions;
    a first electrode coupled to said second surface of said electrically conductive and optically transparent or semi-transparent layer; and
    a second electrode coupled to said first conductive layer.

2. The device of claim 1, wherein said electrically conductive and optically transparent or semi-transparent layer is an indium tin oxide ("ITO") layer capable of spreading electrical current over said second surface of said second conductive layer.

3. The device of claim 2, wherein said plurality of pre-defined geometric shaped thick regions of said pattern is situated adjacent to said plurality of thin regions of said pattern.

4. The device of claim 3, wherein a range of thickness for said thick regions is from 5 to 5000 angstroms ("Å").

5. The device of claim 3, wherein a range of thickness for said thin regions is from 5 to 5000 angstroms ("Å").

6. The device of claim 1, wherein said first conductive layer is an n-type gallium nitride ("GaN") layer.

7. The device of claim 1, wherein said second conductive layer is a p-type GaN layer.

8. The device of claim 1, wherein said pattern includes a plurality of pre-defined geometric shaped thick regions arranged in triangle shape.

9. The device of claim 1, wherein said pattern includes a plurality of electrically conductive and optically transparent or semi-transparent fingers.

10. A light emitting diode ("LED") lamp, comprising:
    a package; and
    an LED apparatus coupled to the package and including:
        a first conductive layer deposited over a substrate;
        an active layer deposited over said first conductive layer and configured to convert electrical energy to light;
        a second conductive layer having a first surface overlying said active layer and a second surface opposite to said first surface;
        an electrically conductive and optically transparent or semi-transparent layer having a first surface and a second surface, wherein said first surface of said electrically conductive and optically transparent or semi-transparent layer overlies said second surface of said second conductive layer, wherein said second surface of said electrically conductive and optically transparent or semi-transparent layer includes a pattern having a plurality of pre-defined geometric shaped thick regions and a plurality of thin regions, wherein the plurality of thin regions occupies approximately fifty percent (50%) of the pattern wherein said plurality of pre-defined geometric shaped thick regions are configured to distribute at least a portion of electric current to said plurality of thin regions;
        a first electrode coupled to said second surface of said electrically conductive and optically transparent or semi-transparent layer; and
        a second electrode coupled to said first conductive layer.

11. The lamp of claim 10, wherein said electrically conductive and optically transparent or semi-transparent layer is an indium tin oxide ("ITO") layer capable of spreading electrical current over said second surface of said second conductive layer.

12. The lamp of claim 11, wherein said plurality of pre-defined geometric shaped thick regions of said pattern is situated adjacent to said plurality of thin regions of said pattern.

13. The lamp of claim 12, wherein a range of thickness for said thick regions is from 5 to 5000 angstroms ("Å").

14. The lamp of claim 12, wherein a range of thickness for said thin regions is from 5 to 5000 angstroms ("Å").

15. The lamp of claim 10, wherein said pattern includes a plurality of pre-defined geometric shaped thick regions arranged in triangle shapes.

16. An illumination device capable of emitting light comprising the LED lamp of claim 10.

17. A street light capable of illuminating a section of a street comprising the LED lamp of claim 10.

18. A lighting device, comprising:
    a light emitting layer capable of generating optical light in response to an electric current; and
    an electrically conductive and optically transparent or semi-transparent layer dispensed over said light emitting layer for distributing said electrical current;
    wherein said electrically conductive and optically transparent or semi-transparent layer is structured with a geometric pattern including a plurality of pre-defined geometric shaped thick regions and a plurality of pre-defined geometric shaped thin regions, wherein said plurality of pre-defined geometric shaped thick regions are configured to distribute at least a portion of electric current to said plurality of pre-defined geometric shaped thin regions, wherein the plurality of thin regions occupies approximately fifty percent (50%) of the pattern.

19. The device of claim 18, wherein said plurality of pre-defined geometric shaped thick regions have approximately same height.

20. The device of claim 19, wherein said plurality of pre-defined geometric shaped thin regions have approximately same height.

21. The device of claim 20, wherein a portion of said plurality of pre-defined geometric shaped thin regions are shaped in triangles.

22. The device of claim 20, wherein a portion of said plurality of pre-defined geometric shaped thick regions are shaped in triangles.

23. The device of claim 20, wherein a portion of said plurality of pre-defined geometric shaped thin regions are shaped in squares.

24. The device of claim 20, wherein a portion of said plurality of pre-defined geometric shaped thick regions are shaped in squares.

25. The device of claim 20, wherein a portion of said plurality of pre-defined geometric shaped thin regions are shaped in circles.

26. The device of claim 20, wherein a portion of said plurality of pre-defined geometric shaped thick regions are shaped in circles.

* * * * *